United States Patent [19]

Pierce et al.

[11] Patent Number: 4,630,343

[45] Date of Patent: Dec. 23, 1986

[54] PRODUCT FOR MAKING ISOLATED SEMICONDUCTOR STRUCTURE

[75] Inventors: John M. Pierce, Palo Alto; William I. Lehrer, Los Altos, both of Calif.

[73] Assignee: Fairchild Camera & Instrument Corp., Cupertino, Calif.

[21] Appl. No.: 773,842

[22] Filed: Sep. 6, 1985

Related U.S. Application Data

[63] Continuation of Ser. No. 362,347, Mar. 26, 1982, abandoned, which is a continuation-in-part of Ser. No. 243,987, Mar. 16, 1981, abandoned.

[51] Int. Cl.⁴ .................................. H01L 21/461
[52] U.S. Cl. ........................... 29/576 W; 29/578; 29/580; 148/187
[58] Field of Search ............... 29/571, 576 W, 578, 29/580; 148/174, 187; 357/54, 73; 501/55

[56] References Cited

U.S. PATENT DOCUMENTS

| | | | |
|---|---|---|---|
| 3,415,680 | 12/1968 | Perri et al. | 148/187 X |
| 3,542,572 | 11/1970 | Dalton et al. | 148/187 X |
| 3,793,068 | 2/1974 | Pammer | 148/188 |
| 4,281,448 | 8/1981 | Barry et al. | 148/187 X |
| 4,284,659 | 8/1981 | Jaccodine et al. | 148/187 X |
| 4,417,914 | 11/1983 | Lehrer | 65/60.53 |
| 4,455,325 | 6/1984 | Razouk | 148/188 |

FOREIGN PATENT DOCUMENTS 114355 10/1978 Japan.
1461943 1/1977 United Kingdom.

OTHER PUBLICATIONS

Li et al., IBM TDB, vol. 19, No. 11, Apr. 1977.
Gardiner et al., IBM Technical Disclosure Bulletin, "Fabricating Monolithic Circuits", vol. 10, No. 5, Oct. 1967, pp. 655 and 666.

Primary Examiner—George T. Ozaki
Attorney, Agent, or Firm—Carl Silverman; David H. Carroll; Steven F. Caserza

[57] ABSTRACT

An integrated circuit structure comprises a plurality of islands of semiconductor material (16-1 through 16-5) each island being separated from adjacent islands by a groove formed in annular shape around said island to laterally define the dimensions of each such island, an oxide (12, 14) formed over the surface of said grooves (13-1 through 13-6) and said islands and a selected glass (15) deposited on said oxide (14) in the grooves and over the top surface of said device, said glass having the property that it flows at a temperature beneath the temperature at which dopants in the islands of semiconductor material substantially redistribute, said selected glass (15) having a substantially flat top surface thereby to give said structure a substantially flat top surface.

10 Claims, 9 Drawing Figures

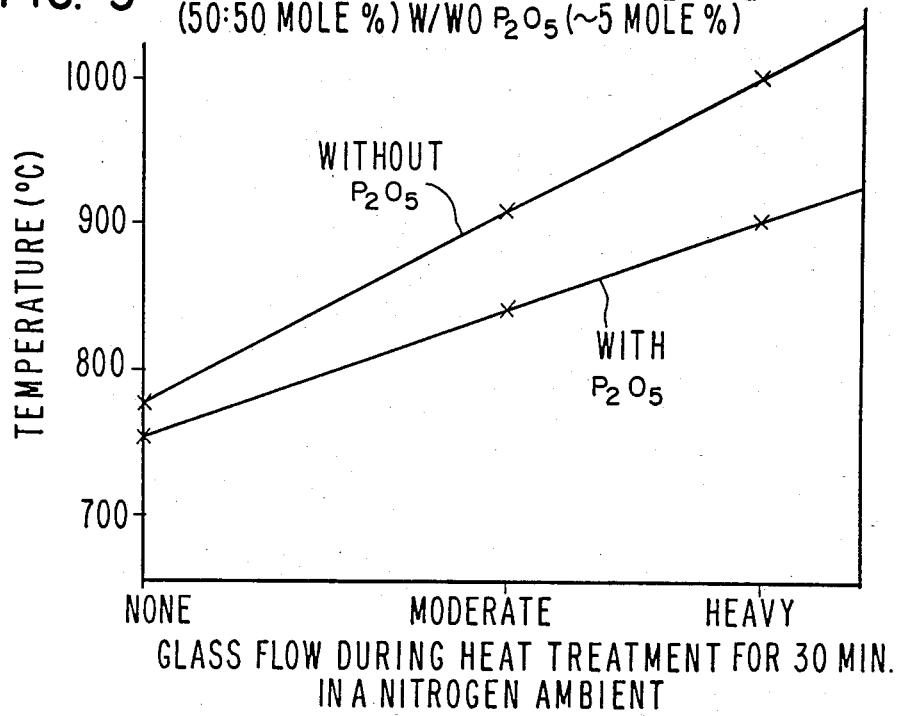
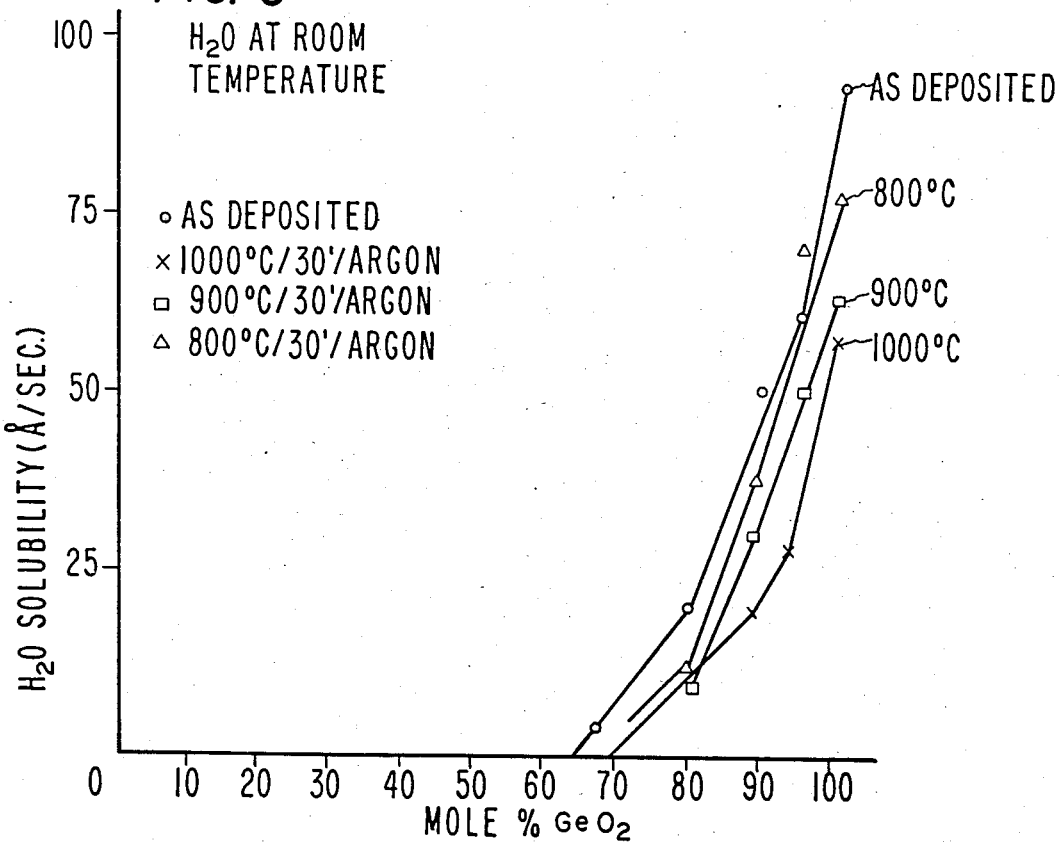

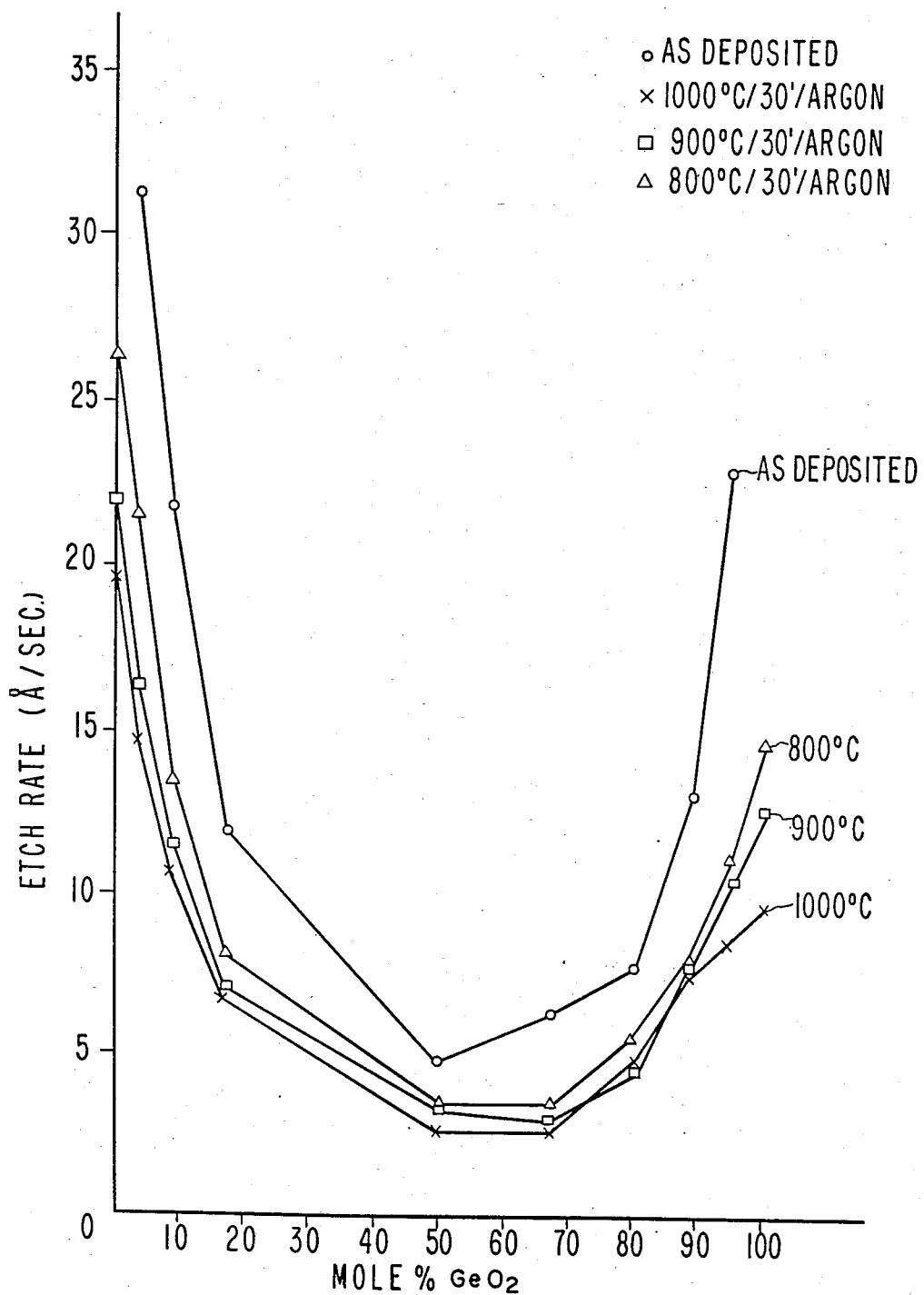

PRODUCT FOR MAKING ISOLATED SEMICONDUCTOR STRUCTURE

BACKGROUND OF THE INVENTION

1. Related Application

This is a continuation of abandoned application Ser. No. 362,347 filed Mar. 26, 1982, which is a continuation-in-part of application Ser. No. 243,987 filed Mar. 16, 1981, now abandoned.

2. Field of the Invention

This invention relates to integrated circuits fabricated using glass isolation techniques and in particular to an integrated circuit fabricated using such techniques wherein the surface of the glass formed in the isolation grooves is substantially flat.

3. Description of the Prior Art

The use of oxide for isolating islands of semiconductor material in which are formed active devices is well-known. Thus, U.S. Pat. No. 3,648,125 on an invention of Peltzer discloses the basic oxide isolation technique now commonly employed in the manufacture of high density fast integrated circuits. Two problems with prior art oxide isolated structures of the types disclosed in the 3,648,125 patent are (1) the grown oxide encroaches into the active regions of the devices, and (2) the interconnection of the active devices becomes more difficult due to surface irregularities in the isolating oxide. Thus in the standard oxide isolation technique wherein a groove is formed in epitaxial silicon and the resulting exposed silicon is oxidized, a "bird-beak" is well-known to form at the intersection between the semiconductor material in which active devices are to be formed and the oxide isolation regions. While in most oxide isolated semiconductor devices manufactured prior to the filing date of this specification, this bird-beak is not an insurmountable problem, as the active devices become smaller, this bird-beak becomes a greater hindrance to the achievement of high yields.

SUMMARY

This invention overcomes the prior art problems associated with the thermal oxidation of semiconductor materials by providing an alternative method and structure which yields an isolation region composed of a glass which has a substantially flat top surface.

In accordance with this invention, grooves are etched in the semiconductor material to form a plurality of islands of semiconductor material in which can be formed active devices. A thin, thermal oxide is then grown over the surface of the device and a binary glass of a unique composition in accordance with this invention is deposited at a first selected temperature in the grooves. The deposited glass is then flowed into the grooves at a second selected temperature. The formation of the glass in the grooves occurs after the active devices have been formed in the islands of semiconductor material and the flowing of the glass occurs at a temperature substantially beneath that required for the diffusion of dopants in the semiconductor material. Accordingly, the isolation technique does not result in the redistribution of dopants and thereby avoids the deleterious effect on electrical properties which would be achieved by the redistribution of dopants.

DESCRIPTION OF THE DRAWINGS

FIG. 3 illustrates the flow characteristics for the binary glass of this invention wherein the silicon dioxide and the germanium dioxide are arranged in 50–50 mole percent concentration, both with and without $P_2O_5$ added;

FIG. 4 illustrates the etch rate (angstroms per second) of the binary glass in a buffered HF etch as a function of the mole percent concentration of $GeO_2$ in the binary $SiO_2$—$GeO_2$ glass; and FIG. 5 is a graph illustrating the solubility in terms of angstroms per second of the binary $SiO_2$—$GeO_2$ glass in water at room temperature as a function of mole percent concentration of $GeO_2$ in the binary glass.

DETAILED DESCRIPTION

Figure 1A:
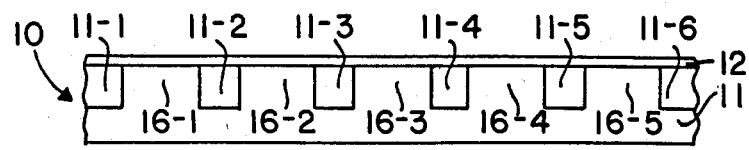
FIGS. 1a through 1e show cross-sectional views of a semiconductor wafer at sequential steps in the process of this invention.

While this invention will be described in conjunction with the drawings, it should be understood that this invention can be employed in structures other than those shown for illustrative purposes in the drawings. Thus, this description is illustrative only and is not intended to limit the scope of the invention.

As shown in FIG. 1a, semiconductor wafer 10 comprises a semiconductor substrate 11 (only a portion of which is shown for illustrative purposes only) on which has been formed a layer of oxide 12 over the top surface of the wafer. Prior to the formation of oxide 12, wafer 10 has been subjected to the standard processing techniques for the formation of active devices within the semiconductor material 11. These devices typically comprise emitter, collector and base regions of bipolar transistors if the structure represents a bipolar device or comprise source, drain and channel regions if the structure comprises an MOS device. The principles of this invention are equally applicable to MOS and bipolar processing techniques and thus the description is not intended to limit the invention to use with one or the other of these types of devices.

The active devices are formed in the surface of substrate 11 in the to-be-formed islands 16-1 through 16-5 of semiconductor material leaving regions 11-1 through 11-6 between the to-be-formed islands of semiconductor material. No active devices are to be formed in regions 11-1 through 11-6 shown in cross-section in FIG. 1a. It should be understood that a typical island, such as island 16-2, in which active devices have been formed, is surrounded on all sides by regions such as regions 11-1 through 11-6 as shown in cross-section in FIG. 1a so as to be laterally isolated from the adjacent to-be-formed islands 16 of semiconductor material. The five islands 16-1 through 16-5 are merely five of a plurality of such islands formed in a given device and thus are merely illustrative as to number and not limiting.

Figure 1B:
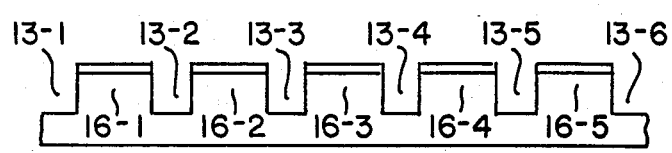

Following the fabrication of the active devices in the to-be-formed islands 16 of semiconductor material, grooves are etched between the islands using standard silicon etching techniques. Typically, the grooves 13-1 through 13-6 (shown in FIG. 1b) are formed to a depth of approximately 1–2 microns using an acid or plasma etch well-known in the semiconductor arts. For wet etching of silicon a nitride mask of a type well-known in the semiconductor arts is used. The to-be-formed islands 16 of active semiconductor material are covered by oxide 12, a nitride layer (not shown) and photoresist which protects these islands from the etch.

Figure 1C:
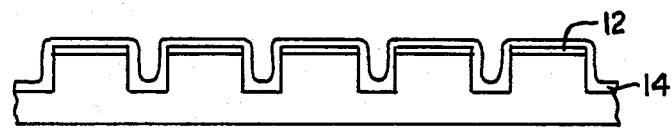

Following the formation of grooves 13-1 through 13-6, the structure is thermally oxidized in a well-known manner to form a thin thermal oxide layer 14 of approximately 1000-2000 angstroms over the surfaces of the grooves. Other oxide thicknesses can be employed if desired. The resulting structure is shown in FIG. 1c.

Figure 1D:
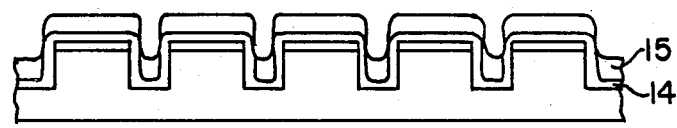

After thermal oxide layer 14 is formed on wafer 10, the binary glass 15 of this invention is deposited over the top surface of this structure to both fill grooves 13-1 through 13-6 and to form additional glass 15 on top of islands 16-1 through 16-5. This structure is illustrated schematically in FIG. 1d. In accordance with this invention the binary glass comprises a mixture of oxide of germanium and oxide of silicon and typically comprises a binary $GeO_2$—$SiO_2$ glass co-deposited using chemical vapor deposition at a temperature of 350° C. to 500° C. from a silane-germane source in an oxygen environment. This glass is formed to a selected thickness, typically approximately 1-3 microns.

Figure 1E:
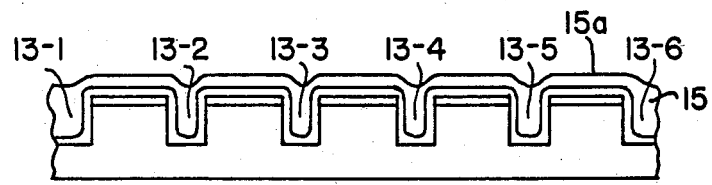

Following the deposition of glass 15, the structure is heated (preferably in a nitrogen environment) to a temperature in the range of 650° C. to 1000° C. The glass reflows into the grooves 13-1 through 13-6 to yield a structure as shown in FIG. 1e wherein glass 15 fills grooves 13-1 through 13-6 to provide a substantially flat top surface 15a. Because the glass reflows at less than 950° C., the dopants in the islands 16-1 through 16-5 are not substantially affected by this heating and glass reflow step and the electrical characteristics of the device remain unaltered when the glass is reflowed below this temperature.

FIG. 3 illustrates the flow characteristics for the binary $GeO_2$—$SiO_2$ glass deposited in accordance with the teachings of this invention. The glass characterized by the graph of FIG. 3 comprises an $SiO_2$—$GeO_2$ glass in 50-50 mole percent of $SiO_2$ and $GeO_2$ both with and without phosphorus pentoxide ($P_2O_5$). The glass with phosphorus pentoxide contains five (5) mole percent of phosphorus pentoxide. FIG. 3 illustrates that during heat treatment for thirty (30) minutes in a nitrogen ambient, the glass with phosphorus pentoxide added flowed heavily at a temperature slightly under 900° C. Heavy flow of the glass was obtained without phosphorus pentoxide at a temperature of slightly under 1000° C. Moderate flows were obtained without phosphorus pentoxide at a temperature around 900° C. and with phosphorus pentoxide at a temperature just over 800° C. Thus phosphorus pentoxide in the glass reduces the temperature required to achieve a given flow.

FIG. 4 illustrates that the etch rate using a standard oxide etch (a buffered HF known in the art as a "500 etch") of the binary glass is a minimum when the mole concentration of $GeO_2$ in the binary $GeO_2$—$SiO_2$ glass is about fifty (50) percent. A change in the mole percent concentration of $GeO_2$ relative to $SiO_2$ in either direction about this point results in an increase in the etch rate of this glass. The various curves illustrate also the effect on the etch rate of first flowing the deposited glass at three different temperatures (1000° C. for 30 minutes in argon gas, 900° C. for 30 minutes in argon gas and 800° C. for 30 minutes in argon gas). While the flowing of the glass flattens the curve of etch rate versus mole percent $GeO_2$ at its minimum such that the minimum etch rate occurs for a mole percent $GeO_2$ between about 50-70 mole percent, the minimum etch rates are still obtained with a glass that includes a mole percent of $GeO_2$ of about 50%.

FIG. 5 illustrates the water solubility at room temperature of the binary $GeO_2$—$SiO_2$ glass as a function of mole concentration of $GeO_2$. FIG. 5 shows that the water solubility (in terms of angstroms per second of glass removed in water) is approximately zero beneath a mole percent concentration of $GeO_2$ of 60%. Accordingly, the mole percentage of $GeO_2$ in the binary glass should not exceed 60% and preferably, for safety, should remain slightly beneath this percentage. When FIG. 5 is compared to FIG. 4 giving the minimum etch rate of the binary glass, it is clear that a mole percentage of $GeO_2$ of about 50% in the binary glass is optimum because for greater preciseness and control in the etching of vias through the binary glass, a binary glass with minimum etch rate is desirable. Moreover, FIG. 3 illustrates that a 50-50 mole percent $SiO_2$—$GeO_2$ binary glass has satisfactory flow characteristics for integrated circuit structures. Thus, a binary glass of about 50-50 mole percent $SiO_2$—$GeO_2$ is preferred for use in this invention.

EXAMPLE 1

A typical composition suitable for deposition over an interconnect structure comprising either aluminum, polysilicon or a polysilicide comprises a binary glass consisting of forty-nine (49) mole percent $SiO_2$, forty-nine (49) mole percent $GeO_2$ and two (2) mole percent $P_2O_5$ (corresponding to about 3.9 weight percent $P_2O_5$ in the resulting glass).

EXAMPLE 2

Typical deposition conditions using a Pyrox atmospheric CVD reactor made by Tempress involved the flow of germane ($GeH_4$), silane ($SiH_4$), oxygen ($O_2$), nitrogen ($N_2$) and phosphine ($PH_3$) in the Pyrox reactor at the following flow rates:

| Constituents | Flow Rates |
| --- | --- |
| $GeH_4$ | 3.67 cc/minute |
| $SiH_4$ | 7.33 cc/minute |
| $O_2$ | 100 cc/minute |
| $N_2$ | 2 liter/minute |
| $PH_3$ (1% in $N_2$) | 11 cc/minute |

The substrates on which the glass was deposited comprised patterned silicon wafers held at 400° C. The binary glass deposited at a rate of approximately 300 Angstroms per minute.

END EXAMPLES

Figure 2:
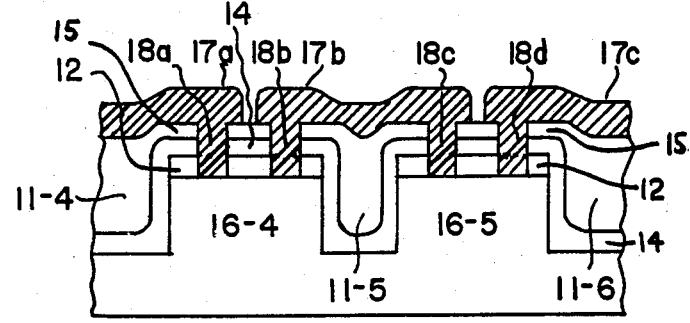
FIG. 2 shows in cross-section an integrated circuit structure, including interconnects on the top surface of the structure, manufactured in accordance with this invention.

FIG. 2 illustrates a portion of the structure shown in cross-section in FIG. 1e wherein additional interconnects 17a, 17b and 17c have been formed over the reflowed glass filling grooves 11-4, 11-5 and 11-6. Interconnect 17b contacts an active region formed in island 16-4 through via 18b opened through the $GeO_2$—$SiO_2$ glass layer 15 and oxide layers 12 and 14 and connects this active region to an active region formed in island 16-5 through via 18c opened through glass 15 and oxide layers 12 and 14. Interconnect 17c connects an active region formed within island 16-5 contacted through opening 18d in glass 15 and oxide layers 12 and 14 to another active region or a contact pad. Interconnect 17a connects an active region formed in island 16-4 and contacted through via 18a to another active region formed in another island or to a contact pad.

In one embodiment, wafer 10 comprises a substrate 11 of silicon material processed in a standard manner to form active devices within selected regions 16-1 through 16-5 (FIG. 1a) of the structure. Oxide layer 12 is formed on the top surface of wafer 10 in a standard, well-known manner. A layer of silicon nitride (not shown) is formed over oxide layer 12 in a standard well-known manner and is used to mask and thus protect those regions of silicon material 16-1 through 16-5 in which are formed active regions. Grooves are then etched in silicon material 11 using a standard silicon etch comprising, for example, a mixture of hydrofluoric, acetic, and nitric acid and then the resulting grooved silicon is further oxidized to form oxide layer 14 using well-known oxidation techniques. Oxide layer 14 is formed typically at a temperature of 900° C., sufficiently below the temperature at which significant diffusion takes place to prevent substantial change in the electrical properties of the active devices formed in islands 16-1 through 16-5. The binary glass of this invention is then formed as described above over the top surface of the device and the structure is heated to a temperature of about 950° C. to reflow this binary glass so as to form a substantially flat top surface. Vias 18a through 18d are opened through oxide layers 12 and 14 and glass 15 in a standard well-known manner using photoresist masking techniques and a selected etchant (such as buffered hydrofluoric acid). Interconnect lead structures are then formed in a well-known manner over the top surface of the device from a selected conductive material, typically aluminum although polycrystalline silicon or a metal silicide can also be used.

This invention has been described in conjunction with one embodiment. It will be apparent to those skilled in the art that other embodiments of this invention and other materials will be suitable for use in accordance with the principles of this invention.

What is claimed is:

1. The method of forming an isolated semiconductor structure comprising:
   forming active devices or selected components in to-be-formed islands of semiconductor material, each island being separated from adjacent islands by a band of semiconductor material in which are formed no active devices, said active devices being formed by placing selected dopants in said to-be-formed islands to form selectively doped regions in said islands;
   etching grooves in the surface of the semiconductor material so as to remove a portion of each band in which no active devices were formed, thereby to create a plurality of islands of semiconductor material, each island containing active devices;
   oxidizing the semiconductor material exposed by said grooves to form an oxide layer of selected thickness over the surface of said grooves;
   forming and smoothing a thin glass film on the resulting structure by
   (a) reacting a gaseous mixtures of germane and silane with oxygen at a reaction temperature of from 350°14 500° C. to form a mixed germanium oxide/silicon oxide glass vapor;
   (b) depositing said glass mixture vapor on said resulting structure as a film of less than about 3 microns in thickness, said germanium oxide being about 50 mole percent of the germanium oxide/silicon oxide glass mixture; and
   (c) reflowing the resulting glass film at a temperature range of approximately 650° C. to 1000° C. to smooth the surface topography of the film to an essentially flat surface.

2. The method of claim 1 wherein said semiconductor material comprises silicon.

3. The method of claim 1 including the additional step of forming on the substantially flat surface over the top of said device a plurality of openings through the selected glass and through said underlying oxide material and forming a selected interconnect pattern of conductive material over the top surface of said device so as to interconnect selected ones of said active devices or selected components.

4. The method of claim 1 wherein said reacting and depositing is performed in a chemical vapor deposition reactor.

5. The method of claim 4 wherein said gaseous mixture includes a nitrogen carrier gas.

6. The method of claim 5 wherein said germane has a flow rate of approximately 3.67 cc/min, said silane has a flow rate of approximately 7.33 cc/min, said oxygen has a flow rate of approximately 100 cc/min, and said nitrogen has a flow rate of approximately 2 liters/min.

7. The method of claim 6 wherein said reacting occurs at approximately 400° C.

8. The method of claim 1 further including introducing a phosphorus compound into said gaseous mixture to provide a resultant phosphorus doped glass film.

9. The method of claim 8 wherein said phosphorus doped glass film contains from two to five mole percent phosphorus pentoxide.

10. The method of forming an isolated semiconductor structure comprising:
    forming active devices or selected components in to-be-formed islands of semiconductor material, each island being separated from adjacent islands by a band of semiconductor material in which are formed no active devices, said active devices being formed by placing selected dopants in said to-be-formed islands to form selectively doped regions in said islands;
    etching grooves in the surface of the semiconductor material so as to remove a portion of each band in which no active devices were formed, thereby to create a plurality of islands of semiconductor material, each island containing active devices;
    oxidizing the semiconductor material exposed by said grooves to form an oxide layer of selected thickness over the surface of said grooves;
    forming and smoothing a glass film on the resulting structure by
    (a) reacting a gaseous mixture of germane and silane with oxygen at a reaction temperature of from 350°-500° C. to form a mixed germanium oxide/silicon oxide glass vapor;
    (b) depositing said glass mixture vapor on said resulting structure as a film, said germanium oxide being about 50 mole percent of the germanium oxide/silicon oxide glass mixture; and
    (c) reflowing the resulting glass film at a temperature range of approximately 650° C. to 1000° C. to smooth the surface topography of the film to an essentially flat surface.

* * * * *